United States Patent [19]

Holland-Moritz

[11] 4,131,852
[45] Dec. 26, 1978

[54] SINGLE DISPERSIVE DELAY LINE COMPRESSIVE RECEIVER

[75] Inventor: Ervin K. Holland-Moritz, Ann Arbor, Mich.

[73] Assignee: The United States of America as represented by the Secretary of the Air Force, Washington, D.C.

[21] Appl. No.: 837,135

[22] Filed: Sep. 28, 1977

[51] Int. Cl.$^2$ ............................................. H04B 17/00
[52] U.S. Cl. .................................. 325/363; 324/77 B
[58] Field of Search ................. 325/67, 332, 335–337, 325/363, 325; 324/77 C, 77 B, 77 CS; 343/17.7, 5 SA

[56] References Cited

U.S. PATENT DOCUMENTS

| | | | |
|---|---|---|---|
| 2,954,465 | 9/1960 | White | 325/336 |
| 3,337,800 | 8/1967 | Halley et al. | 343/5 SA |
| 3,729,738 | 4/1973 | Cross et al. | 324/77 CS |
| 4,005,417 | 1/1977 | Collins | 343/5 SA |

Primary Examiner—Robert L. Richardson
Assistant Examiner—Jin F. Ng
Attorney, Agent, or Firm—Joseph E. Rusz; James S. Shannon

[57] ABSTRACT

A wideband compressive receiver using only one surface acoustic wave (SAW) device in a time-multiplexed fashion. A short pulse into the SAW device generates a "downchirp" local oscillator sweep signal which, after appropriate band limiting, is mixed with the incoming signal of unknown frequency. The lower sideband is filtered out and applied to the same SAW device as an "upchirp". Timing of the resulting compressed pulse emanating from the SAW device output is related to the frequency of the unknown signal.

2 Claims, 2 Drawing Figures

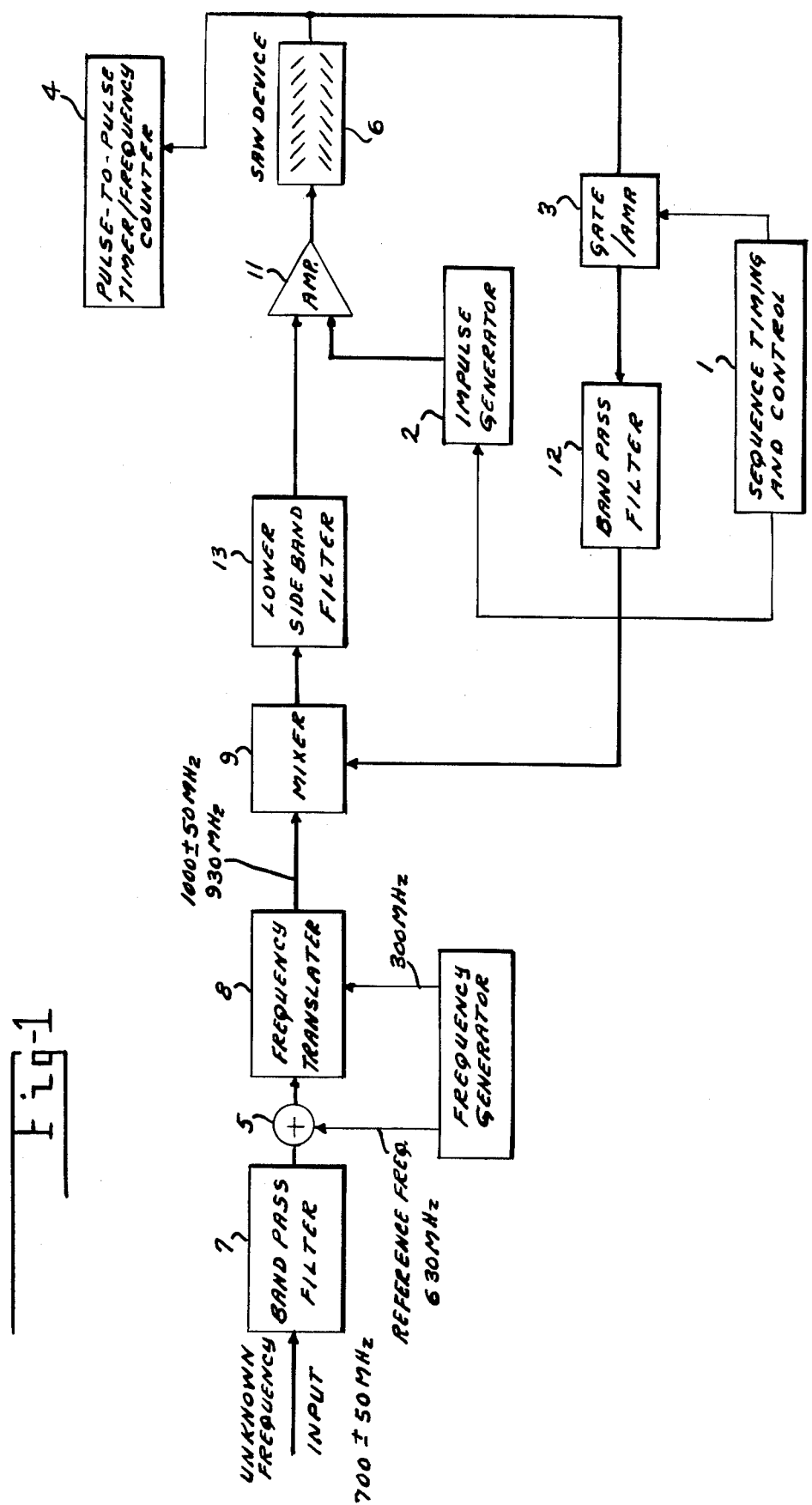

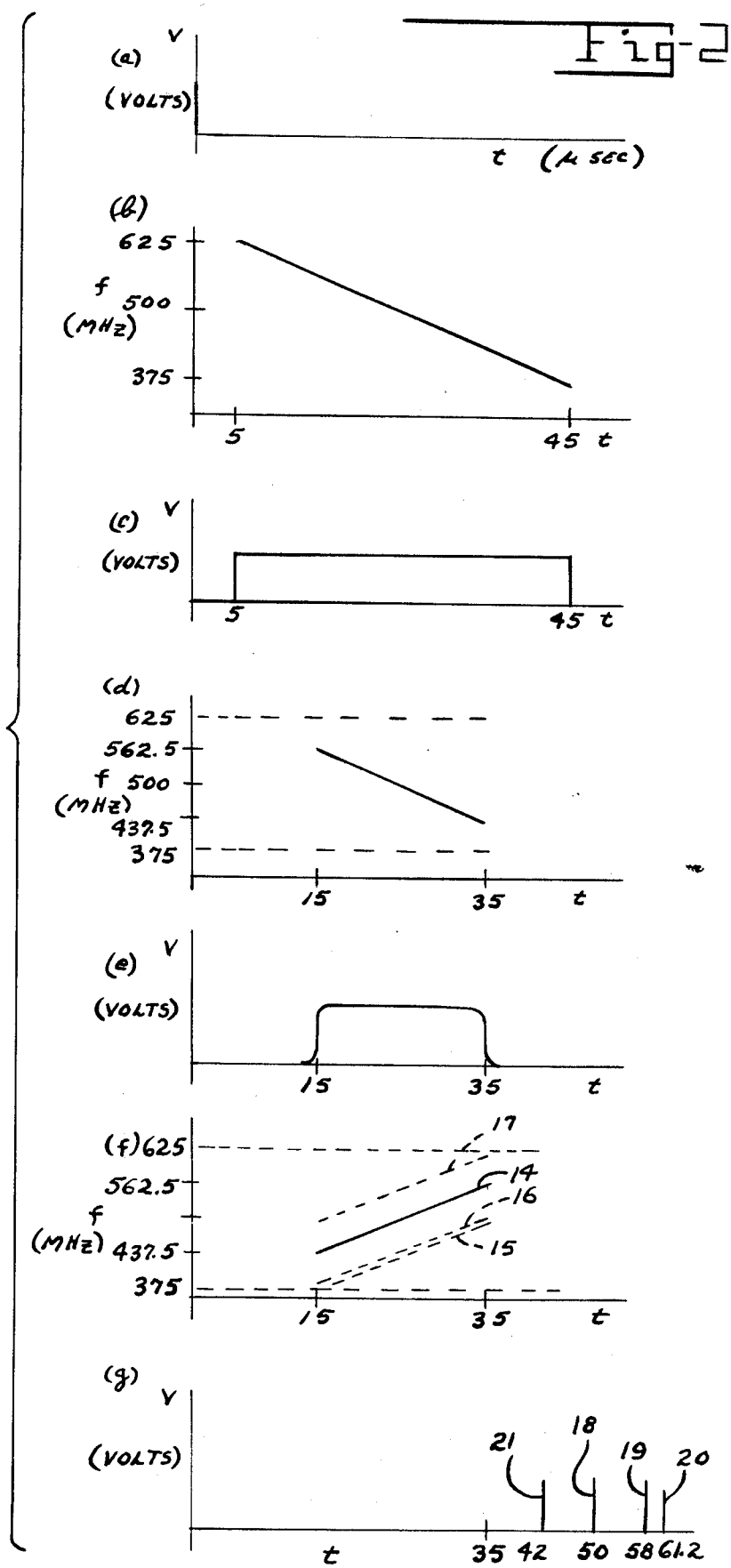

SINGLE DISPERSIVE DELAY LINE COMPRESSIVE RECEIVER

RIGHTS OF THE GOVERNMENT

The invention described herein may be manufactured and used by or for the Government of the United States for all governmental purposes without the payment of any royalty.

BACKGROUND OF THE INVENTION

This invention relates to wideband compressive receivers. More particularly, the invention addresses itself to such receivers designed to rapidly and accurately locate a single frequency signal in a wideband frequency space using a surface acoustic wave (SAW) device in a time-multiplexed fashion.

The use of signal compression techniques and dispersive delay lines in the location of radio signals of an unknown but constant frequency is known in the art. The application of multiple SAW devices to perform the function of signal dispersion and compression, though more contemporary, is also a technique known in the art.

The traditional approach to the design of wideband compressive receivers entails the application of two delay lines in conjunction with the associated electronics. The function of the first delay line is to generate the local oscillator frequency sweep (chirp) signal. After appropriate mixing with the unknown frequency signal being received, the resultant signal is applied to a compressive delay line to extract information on the frequency of the received signal.

As the bandwidth within which the unknown signal could lie increases, the complexity and expense associated with using two matched delay lines, whether SAW devices or otherwise, becomes prohibitive. The wide frequency band makes it very difficult and expensive to accurately match the dispersive and compressive nature of delay lines in terms of their nonlinearities in the slope of delay time versus frequency.

SUMMARY OF THE INVENTION

According to this invention a wideband compressive receiver is configured using only one SAW dispersive delay line for both sweep generation and mixed signal compression, through the implementation of chirp frequency inversion and time-multiplexed SAW transmission. A short pulse is applied to the SAW device, generating a "downchirp" sweep signal to perform the function of the local oscillator. This sweep signal, of a time duration determined by the line delay is mixed with the unknown frequency signal, or a translated signal derived therefrom. The lower sideband of the mixer output is then extracted and exhibits the characteristics of an "upchirp". The upchirp is applied to the input of the SAW delay line, from which a pulse eventually emanates due to compression of the upchirp. The timing of the pulse is relatable to the frequency of the unknown signal.

Inversion of the original downchirp signal to produce an upchirp and the time multiplexed application of the same SAW device not only reduce general cost and complexity of the compressive receiver, but also act directly to proportionately compensate for nonlinear errors introduced by the SAW device. Long term, e.g., aging, and temperature effects are likewise mitigated by the reversal of error contributions upon the second pass through the same SAW device.

BRIEF DESCRIPTION OF THE DRAWINGS

FIG. 1 shows a schematic block diagram of the compressive receiver using a SAW device in a multiplexed fashion.

FIG. 2 displays multiple frequency-time and amplitude-time plots of various points within the compressive receiver of FIG. 1.

DETAILED DESCRIPTION OF THE INVENTION

FIG. 1 depicts the essentials of the present invention in block diagram form, where the operations within the blocks may be performed by standard high frequency semiconductor devices. Functionally, the receiver may be divided into three operations.

First is sequence timing and control block 1, which functions by periodically initiating an impulse from impulse generator 2 and at the proper time closing gate/amp 3 to inhibit the application of output pulse of the SAW line to its input through the mixer 9.

The second operation is that performed by pulse-to-pulse timer/frequency counter 4, which functions to measure the time interval between the pulses of a pair produced at the output of the delay line 6 in a manner which will be described later.

The last operational group in FIG. 1 is that specifically designed to perform dispersion, mixing, filtering and compression. Ancillary to this process are functional blocks 7 and 8 which act upon the high frequency input signal, of unknown frequency, and a reference signal outside the unknown frequency band, introduced through adder 5, to make these signals compatible with the frequency band of the SAW device. Though applications may exist where the input could go directly into the mixer, in most situations electronic processing of the type performed by blocks 7 and 8 will be necessary to make the frequencies compatible with the SAW devices available. Bandpass filter 7 removes noise and out-of-band signals which might otherwise interfere with the compressive receiver action. Block 8, the frequency translater, increases the frequency of input signal to make it compatible with the SAW device and electronic processing techniques.

The other functional elements of the compressive receiver operation are best described by explaining their general action in a time sequence beginning with the generation of an impulse in block 2. More detailed functional interrelationships and relative magnitudes will be provided when the invention embodiment is described by way of the graphs in FIG. 2. The impulse from block 2 is amplified in 11 and applied to dispersive SAW device 6. After a short delay, a time-varying frequency but constant amplitude "downchirp" signal appears at the output of SAW device 6, proceeds through gate/amp 3, and is band limited by block 12. The band limited chirp is then mixed in block 9 with the appropriately frequency translated input from block 8 and the lower sideband extracted by the filter in block 13. The sideband, which in each case is an inversion of the "downchirp" or an "upchirp", is amplified by amp 11 and applied to SAW device 6 from which a pulse emanates, due to the compression of the upchirp, the timing of which is related to the frequency of the signal. Block 4 maintains an accurate measure of this timing, while block 1 inhibits the gate in block 3 to prevent recirculation of the pulse coming out of the SAW device.

Turning now to a specific embodiment of this invention and the functional performance of the elements as displayed graphically in FIG. 2, it should be noted that the frequencies, amplitudes and times shown in the figure are relative to simplify the forthcoming description.

To begin, the input frequency to be located is defined as being within a 100 MHz band between 650 and 750 MHz. The SAW device, block 6 of FIG. 1, has a 250 MHz bandwidth covering the frequencies between 375 MHz and 625 MHz, centered at 500 MHz. Its dispersive characteristics are such that the transit time for the highest frequency, 625 MHz, is 5 $\mu$seconds and increases linearly to about 45 $\mu$seconds at the low frequency end of 375 MHz.

Though the SAW loop of the compressive receiver operates in a multiplex mode, the input signal is processed on a continuous basis and introduced from block 8 into electronic mixer 9. The 700 ± 50 MHz RF input signal is bandpass filtered in block 7 of FIG. 1 to remove extraneous frequencies, and then frequency translated to 1,000 ± 50 MHz in block 8. The frequency conversion in block 8 may be accomplished by mixing 300 MHz with the 700 ± 50 MHz signal and selecting the sum or upper sideband. The frequency band to which the input is translated is selected such that, at the output of mixer 9, the lower sideband center frequency is centered within the SAW device frequency band. A center frequency of 1000 MHz was selected since the lower sideband of 1,000 MHz mixed with 500 MHz is 500 MHz (center frequency of the SAW). Similarly, the 630 MHz reference frequency is translated to 930 MHz.

The other signal to be applied to the electronic mixer, block 9 of FIG. 1, is a band limited chirp signal. This signal is generated by a sequence beginning at time zero when block 1 commands block 2 to generate an impulse; see FIG. 2 (a). The 2 nsecond impulse is amplified by 11 and applied to SAW device 6. The output of the SAW delay line is displayed in FIGS. 2(b) and 2(c), showing the natural response of the SAW line as a "downchirp" signal of a constant amplitude but having a frequency linearly decreasing with time from 625 MHz down to 375 MHz. Also evident is the 5 $\mu$second delay between the pulsing of the SAW line and the first (highest frequency) chirped output.

After proceeding through timing gate/amplifier 3 of FIG. 1, the downchirp is band limited in block 12 to 125 MHz centered on the 500 MHz center frequency of the SAW line and exhibits the signal characteristics plotted in (d) and (e) of FIG. 2. Narrowing of the downchirp bandwidth, which in its original shape effectively represents the bandwidth of the SAW device, is necessary to use the same SAW device in the compression phase of the process. If the signal frequency coming out of block 8 in FIG. 1 is centered within the 100 MHz band of interest, 1,000 MHz in the example given, the output of the lower sideband filter, block 13, is the center frequency of an "upchirp" covering the nearly same frequency band as the downchirp in FIG. 2(d). See solid line plot 14 in FIG. 2(f). On the other hand, if the input signal is at either edge of the 100 MHz band the upchirp output of block 13 in FIG. 1 will be shifted in frequency as shown by broken lines 16 and 17 in FIG. 2(f); where line 16 represents the "upchirp" for a translated input of 950 (1000–50) MHz and line 17 represents the "upchirp" for 1050 (1000 ± 50) MHz. Only if the downchirp impulse response is band limited to approximately 125 MHz in block 12 of FIG. 1 will the lower sideband of the mixed frequencies remain within the bandwidth of the SAW device.

The SAW device by design has a bandwidth of 500 + 125 MHz. With translated input signal of 950 MHz the lower sideband upchirp would sweep from 387.5 to 512.5 MHz while on the opposite end of the input band, 1050 MHz, the upchirp would cover 487.5 to 612.5 MHz. The minimum and maximum frequencies, 387.5 and 612.5 MHz, are near the limits of the SAW device, 375 to 625, as intended. Line 15 represents the upchirp due to the 630 MHz reference signal.

The lower sideband upchirp signal previously described is then amplified by 11 of FIG. 1 and applied to the input of SAW device 6. The output from the SAW device, acting as a signal compressor, is a pulse with a nominal pulse width of 8 nseconds. The timing of that pulse is related to the frequency shift in the upchirp, which frequency shift is attributable to a variation in the input signal frequency. For example, if the translated input is at center frequency (1000 MHz) the nominal chirp is plot 14 in FIG. 2(f) covering the frequencies of 437.5 to 562.5 MHz and will produce a pulse out of the SAW device at 50 $\mu$seconds after the initial impulse out of block 2 in FIG. 1. This is shown in FIG. 2(g) as pulse 18. Likewise, responses to 50 frequency shifts from center, downward and upward as shown on plots 16 and 17 of FIG. 2(f), produces pulses 19 and 21 at 58 and 42 $\mu$seconds, respectively. Pulse 20, occurring at 61.2 $\mu$seconds, is produced by upchirp 15, and is the reference pulse for timing the pulses, such as 18, 19, and 21, due to the unknown frequency. Block 4 measures the interval between the reference pulse and the pulse due to the unknown frequency.

As the input signal varies in frequency over its ± 50 MHz band the timing of the output pulse varies ± 8 $\mu$seconds from its nominal time of 50 $\mu$seconds.

Gate 3 of FIG. 1 is closed at the appropriate time, e.g. about 35 $\mu$seconds after the initial impulse from block 2, to inhibit recirculation of the timing pulses coming from the SAW device. After an appropriate delay, the sequence is again initiated by block 1, starting with an impulse from block 2. In the case of the invention embodiment, this sequence was repeated every 88 $\mu$seconds.

While the invention has been shown to a particular embodiment thereof, it will be understood by those skilled in the art that various changes in form or application may be made without departing from the spirit and scope of the invention.

I claim:

1. A compressive receiver for determining the frequency of a received signal occurring within a prescribed acceptance band, comprising:
   (a) a surface acoustic wave dispersive delay line having a frequency band wider than said acceptance band;
   (b) means for applying a short impulse to the input of said delay line for producing at its output a downchirp signal of the same bandwidth as the line;
   (c) means providing a reference frequency lying just outside said acceptance band;
   (d) means for translating said acceptance band and said reference frequency by a fixed amount such that the difference between the center frequency of the translated band and the center frequency of said downchirp is at or near the center frequency of said delay line band;

(e) means for deriving the difference between any frequency in said translated band and said downchirp, and the difference between said reference frequency and said downchirp, said difference in each case constituting an upchirp of the same bandwidth as said downchirp;

(f) means for applying said upchirps to the input of said delay line whereby a pair of pulses appears at the delay line output due to compression of said upchirps; and (g) means for measuring the interval between the pulses of said pair, said interval being a measure of the frequency of said received signal.

2. The apparatus of claim 1 and in addition means for limiting the bandwidth of said upchirp to a value such that the upchirps for all frequencies in said acceptance band fall within the bandwidth of say delay line.

* * * * *